United States Patent
Jan et al.

(10) Patent No.: US 6,654,291 B2
(45) Date of Patent: Nov. 25, 2003

(54) ELECTRICALLY ERASABLE PROGRAMMABLE READ-ONLY MEMORY AND METHOD OF ERASING SELECT MEMORY CELLS

(75) Inventors: Shang Tarng Jan, Hsinchu (TW); Der-Tsyr Fan, Tao-Yuan (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/155,953

(22) Filed: May 24, 2002

(65) Prior Publication Data

US 2003/0002346 A1 Jan. 2, 2003

(30) Foreign Application Priority Data

Jun. 15, 2001 (TW) ........................................ 90114542 A

(51) Int. Cl.$^7$ .............................................. G11C 16/04
(52) U.S. Cl. ............................ 365/185.29; 365/185.14; 365/185.31
(58) Field of Search ....................... 365/185.29, 185.33, 365/185.31, 185.14; 257/315, 316

(56) References Cited

U.S. PATENT DOCUMENTS 5,753,953 A * 5/1998 Fukumoto .................. 257/316
5,801,993 A * 9/1998 Choi ...................... 365/185.28

* cited by examiner

*Primary Examiner*—Son Mai
(74) *Attorney, Agent, or Firm*—Townsend and Townsend and Crew LLP

(57) ABSTRACT

Embodiments of the present invention are directed to an improved EEPROM (electrically erasable programmable read-only memory) in which the memory cells can be selectively erased. The EEPROM comprises a first memory cell having a first control gate and a first source, and a second memory cell having second control gate and a second source. If the first and second control gates are configured to receive a control gate voltage, the first source is configured to receive a first source voltage, and the second source is configured to receive a second source voltage different from the first source voltage so as to erase one of the first and second memory cells and to preserve another of the first and second memory cells. If the first and second sources are configured to receive a source voltage, the first control gate is configured to receive a first control gate voltage, and the second control gate is configured to receive a second control gate voltage different from the first control gate voltage so as to erase one of the first and second memory cells and to preserve another of the first and second memory cells.

21 Claims, 3 Drawing Sheets

ELECTRICALLY ERASABLE PROGRAMMABLE READ-ONLY MEMORY AND METHOD OF ERASING SELECT MEMORY CELLS

CROSS-REFERENCES TO RELATED APPLICATIONS

This application claims priority from R.O.C. Patent Application No. 090114542, filed Jun. 15, 2001, the entire disclosure of which is incorporated herein by reference.

BACKGROUND OF THE INVENTION

This invention relates generally to semiconductor devices and, more particularly to an electrically erasable programmable read-only memory.

FIG. 1A is a top-view diagram showing a conventional EEPROM (electrically erasable programmable read-only memory). Memory 1 comprises memory cells 11 arranged in a matrix. Each of the memory cells 11 has a floating gate 14, a drain region 16 and a plug 18 connected to the drain region 16. A doped region 15 is formed to be a common source for the memory cells 11 in two adjacent columns. The memory cells in one column have a common select gate 12 and a common control gate 13. A conducting line 17 electrically connects the drain regions 16 of the memory cells 11 in one line through the plugs 18.

FIG. 1B is a cross-section showing one of the memory cells 11. The memory cell 11 has a substrate 10. The control gate 13, floating gate 14 and select gate 12 are stacked on the substrate 10. A thin oxide 19 is formed between the gates 12, 13, 14 and the substrate 10. The substrate 10 has doped regions for the source 15 and drain 16. The plug 18 is connected to the drain 16, as previously described. Bias voltages SG, CG, CS and D are applied to the select gate 12, control gate 13, common source 15 and drain 16 respectively. TABLE 1 shows values of the bias voltages applied during reading, programming and erasing.

TABLE 1

|    | Program | Erase      |    | Read |
|----|---------|------------|----|------|
| SG | 1.7     | 0          | 0  | 4.4  |
| CG | 8.5     | 0          | −9 | 1.6  |
| CS | 6       | 12         | 6  | 0    |
| D  | 0       | 0/Floating |    | 1.5  |

In TABLE 1, it is noted that a high voltage difference is generated between the source 15 and the floating gate 14 by applying a 12V bias voltage to the source 15 when erasing the memory cell 11, whereby the charges stored in the floating gate 14 are forced to flow into the substrate 10. Alternatively, the high voltage difference between the source 15 and the floating gate 14 can be derived by applying a −9V bias voltage to the control gate 13 which will be coupled to the floating gate 14 and a 6V bias voltage to the source 15. Therefore, the erasing of the memory cell 11 is determined by the bias voltage CG and CS respectively applied to the control gate 13 and common source 15 while the bias voltage SG and D are 0 or floating.

However, all the memory cells 11 in one column are erased simultaneously since their control gates are electrically connected and their sources are electrically connected, i.e., they receive the same bias voltage CG for the control gates and the same bias voltage CS for the common sources. It is impossible to erase only one memory cell 11 in the conventional EEPROM. The invention provides a solution for this problem.

BRIEF SUMMARY OF THE INVENTION

Embodiments of the present invention are directed to an improved EEPROM in which the memory cells can be selectively erased. If the control gates of the memory cells are electrically connected, their sources are electrically isolated from each other, so that the memory cells may receive a common bias voltage for the control gates but different bias voltages for the sources. It is possible to erase only one memory cell by providing the to-be-erased memory cell with a bias voltage for the source different from the bias voltage provided to the sources of the other memory cells. Alternatively, if the same bias voltage is provided to the sources of the memory cells, their control gates are electrically isolated from each other, so that the memory cells may receive different bias voltages for the control gates. It is possible to erase only one memory cell by providing the to-be-erased memory cell with a bias voltage for the control gate different from the bias voltage provided to the control gates of the other memory cells.

In accordance with an aspect of the present invention, an electrically erasable programmable read-only memory comprises a first memory cell having a first control gate and a first source, and a second memory cell having second control gate and a second source. If the first and second control gates are configured to receive a control gate voltage, the first source is configured to receive a first source voltage, and the second source is configured to receive a second source voltage different from the first source voltage so as to erase one of the first and second memory cells and to preserve another of the first and second memory cells. If the first and second sources are configured to receive a source voltage, the first control gate is configured to receive a first control gate voltage, and the second control gate is configured to receive a second control gate voltage different from the first control gate voltage so as to erase one of the first and second memory cells and to preserve another of the first and second memory cells.

In some embodiments, the first memory cell comprises a first floating gate, a first select gate, and a first drain; and the second memory cell comprises a second floating gate, a second select gate, and a second drain. The first drain and the second drain are electrically coupled together. The first select gate and the second select gate are electrically coupled together. The first source voltage is sufficiently higher than the control gate voltage to erase the first memory cell and the second source voltage is not sufficiently higher than the control gate voltage to erase the second memory cell.

In some embodiments, the first source voltage is higher than the control gate voltage by at least about 12V. The second source voltage is higher than the control gate voltage by no more than about 9V, or by no more than about 6V.

In specific embodiments, the first and second control gates have a control gate voltage of about −9V, the first source has a first source voltage of at least about 6V, and the second source has a second source voltage of no greater than about 0V. The first and second control gates each have a control gate voltage of about 0V, the first source has a first source voltage of at least about 12V, and the second source has a second source voltage of no greater than about 0V. The first and second sources have a source voltage of about 6V, the first control gate has a first control gate voltage of no greater than about −9V, and the second control gate has a second control gate voltage of at least about 0V. The first and second sources have a source voltage of about 12V, the first control gate has a first control gate voltage of no greater than about 0V, and the second control gate has a second control gate voltage of at least about 6V.

Another aspect of the present invention is directed to an erasing method for an electrically erasable programmable read-only memory having a first memory cell and a second memory cell, wherein the first memory cell has a first control gate and a first source and the second memory cell has second control gate and a second source. The method comprises either (1) providing a control gate voltage to the first and second control gates, providing a first source voltage to the first source, and providing a second source voltage to the second source which is different from the first source voltage so as to erase one of the first and second memory cells and to preserve another of the first and second memory cells; or (2) providing a source voltage to the first and second sources, providing a first control gate voltage to the first control gate, and providing a second control gate voltage to the second control gate which is different from the first control gate voltage so as to erase one of the first and second memory cells and to preserve another of the first and second memory cells.

DETAILED DESCRIPTION OF THE INVENTION

Figure 1A:
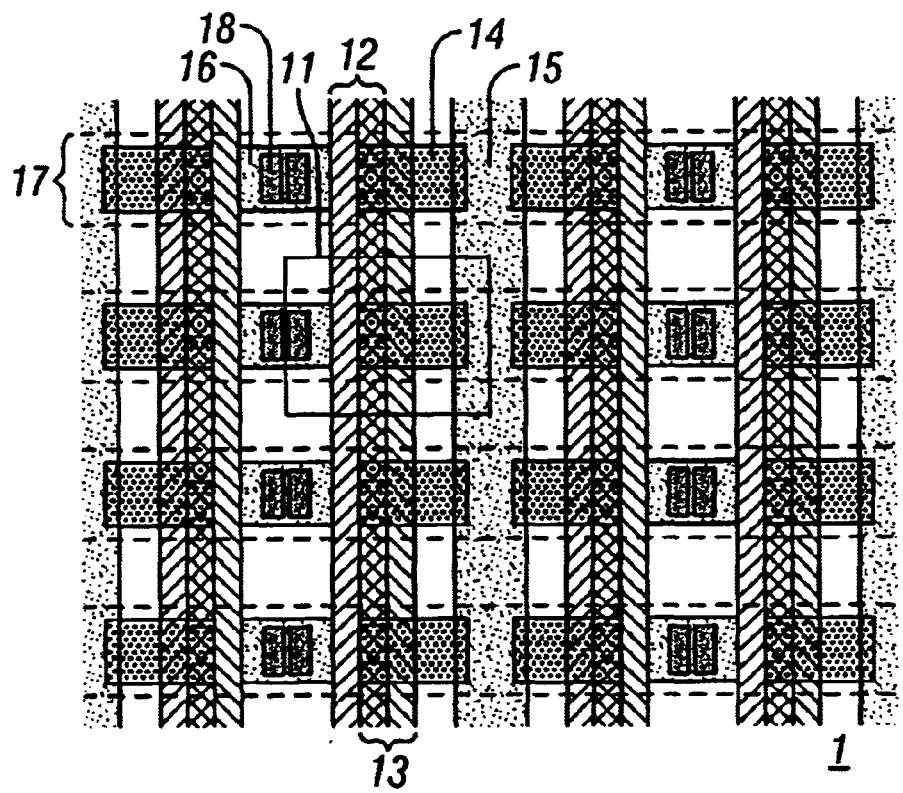
FIG. 1A is a top-view schematic diagram showing a conventional EEPROM.
Figure 1B:
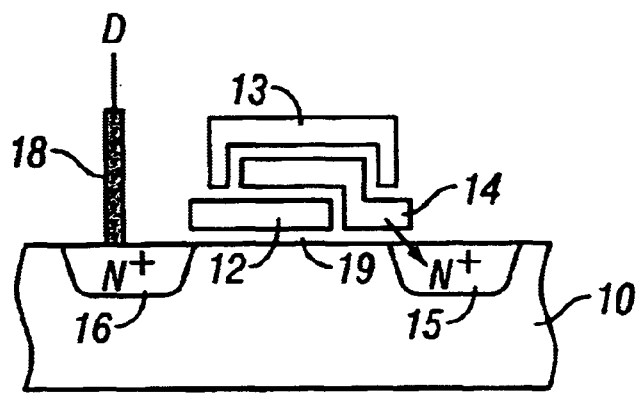
FIG. 1B is a cross-section showing one of the memory cells in the EEPROM of FIG. 1A.
Figure 2A:
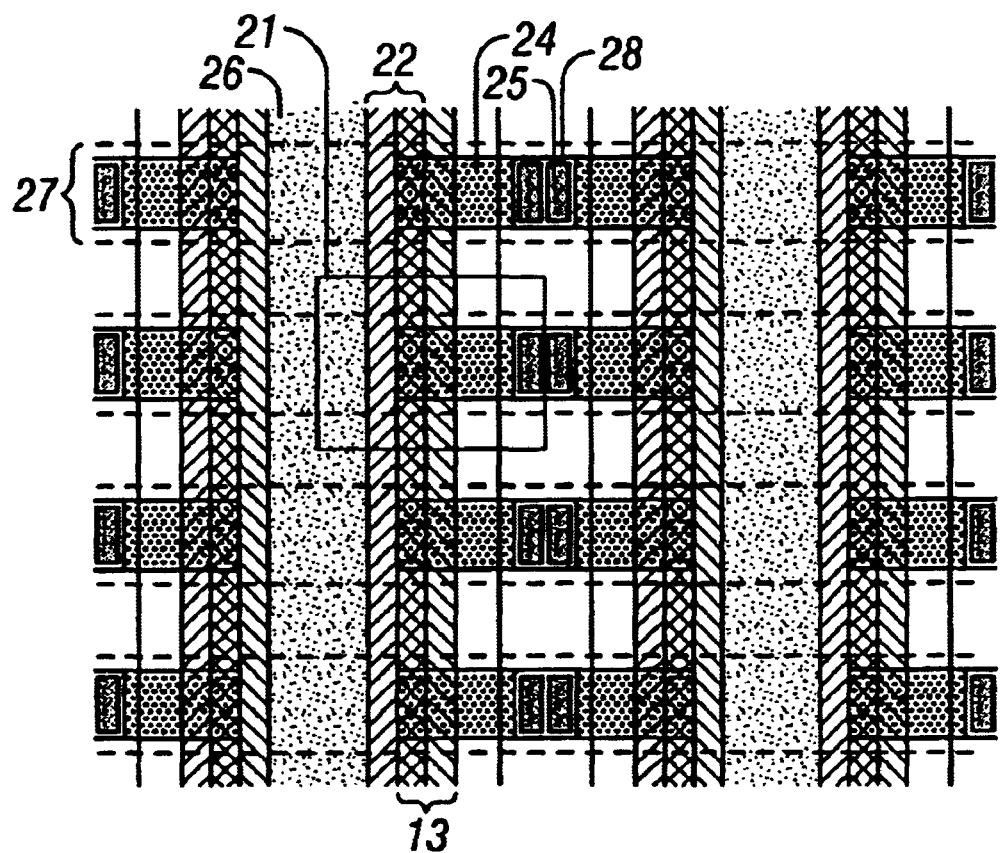
FIG. 2A is a top-view schematic diagram showing an EEPROM according to an embodiment of the invention.

FIG. 2A is a top-view diagram showing an EEPROM according to the invention. A memory 2 comprises memory cells 21 arranged in a matrix. A strip of a control gate layer 23 or a select gate layer 22 connects a column of the memory cells 21 while a strip of a conducting line 27 connects a line of the memory cells 21. Each of the memory cells 21 has a floating gate 24, a source region 25 and a plug 28 connected to the source region 25. A doped region 26 is formed to be a common drain for the memory cells 21 in two adjacent columns. The memory cells 21 in one column have a common select gate 22 and a common control gate 23. The conducting line 27 electrically connects the source regions 25 of the memory cells 21 in one line through the plugs 28.

Figure 2B:
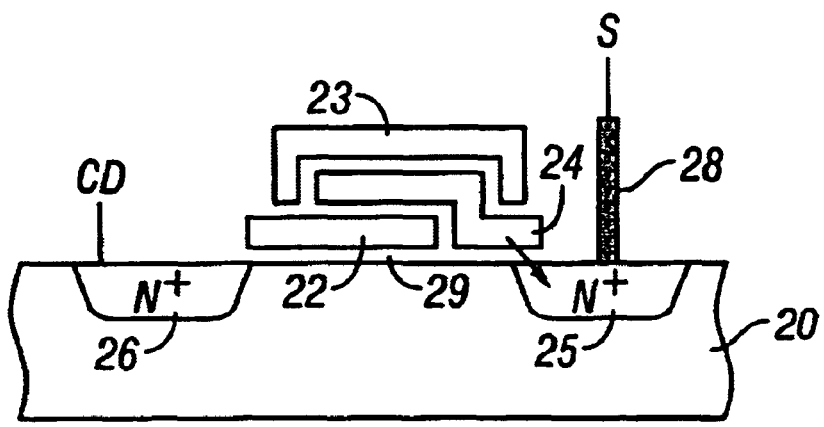
FIG. 2B is a cross-sectional diagram showing one of the memory cells in the EEPROM of FIG. 2A.

FIG. 2B is a cross-sectional diagram showing one of the memory cells 21. The memory cell 21 has a substrate 20. The control gate 23, floating gate 24 and select gate 22 are stacked on the substrate 20. A thin oxide 29 is formed between the gates 22, 23, 24 and the substrate 20. The substrate 20 has doped regions for the source 25 and drain 26. The plug 28 is connected to the source 25, as previously described. Bias voltages SG', CG', CS and D are applied to the select gate 22, control gate 23, source 25 and common drain 26 respectively. TABLE 2 shows values of the bias voltages applied during reading, programming and erasing.

TABLE 2

|           | Program | Erase      | Read |     |
|-----------|---------|------------|------|-----|
| SG'       | 1.7     | 0          | 0    | 4.4 |
| CG'       | 8.5     | 0          | −9   | 1.6 |
| Others CG |         | 6          |      |     |
| CS        | 6       | 12         | 6    | 0   |
| D         | 0       | 0/Floating |      | 1.5 |

In TABLE 2, it is noted that a high voltage difference is generated between the source 25 and the floating gate 24 by applying a 12V bias voltage to the source 25 when erasing the memory cell 21, whereby the charges stored in the floating gate 24 are forced to flow into the substrate 20. For the memory cells that are not to be erased, a 0V bias voltage may be applied to their sources. Alternatively, the high voltage difference between the source 25 and the floating gate 24 can be derived by applying a −9V bias voltage to the control gate 23 which will be coupled to the floating gate 24 and a 6V bias voltage to the source 25. For the memory cells that are not to be erased, a 0V bias voltage may be applied to their sources. Therefore, the erasing of the memory cell 21 is determined by the bias voltage CG' and CS' respectively applied to the control gate 23 and source 25 while the bias voltage SG and D are 0 or floating.

In this embodiment of the invention, all the memory cells 21 in one column have a common control gate but their sources are electrically isolated from each other, whereby they can receive a common bias voltage CG' but different bias voltage CS'. It is possible to erase only one memory cell 21 in one column by providing the to-be-erased cell with a bias voltage CS' different from those provided for others in the column.

In the previously described embodiment, the control gates 23 of the cells in one column are connected but the sources 25 are electrically isolated. The sources 25 of the cells in one column can receive different voltages while the voltages on the control gates 23 are the same. Conversely, the control gates 23 of the cells in one row can receive the same voltage while the voltages on the sources 25 are different. It is possible to erase only one cell by providing different source voltages to the cells in one column. For example, one of the cells in one column is provided with voltages SG', CG', S and CD which are 0, −9, 6 and 0 respectively. The other cells in the column are provided with voltages SG', CG', S and CD which are 0, −9, 0 and 0 respectively. This causes insufficient voltage differences between the sources and control gates to erase the other cells. Only the cell provided with voltages SG', CG', S and CD which are 0, −9, 6 and 0 respectively is erased. Alternatively, one of the cells in one column is provided with voltages SG', CG', S and CD which are 0, 0, 12 and 0 respectively. The other cells in the column are provided with voltages SG', CG', S and CD which are 0, 0, 0 and 0 respectively. This causes insufficient voltage differences between the sources and control gates to erase the other cells. Only the cell provided with voltages SG', CG', S and CD which are 0, 0, 12 and 0 respectively is erased. Alternatively, one of the cells in one row is provided with voltages SG', CG', S and CD which are 0, −9, 6 and 0 respectively. The other cells in the row are provided with voltages SG', CG', S and CD which are 0, 0, 6 and 0 respectively. This causes insufficient voltage differences between the sources and control gates to erase the other cells. Only the cell provided with voltages SG', CG', S and CD which are 0, −9, 6 and 0 respectively is erased. Alternatively, one of the cells in one row is provided with voltages SG', CG', S and CD which are 0, 0, 12 and 0 respectively. The other cells in the row are provided with voltages SG', CG', S and CD which are 0, 6, 12 and 0 respectively. This causes insufficient voltage differences between the sources and control gates to erase the other cells. Only the cell provided with voltages SG', CG', S and CD which are 0, 0, 12 and 0 respectively is erased.

Figure 3:
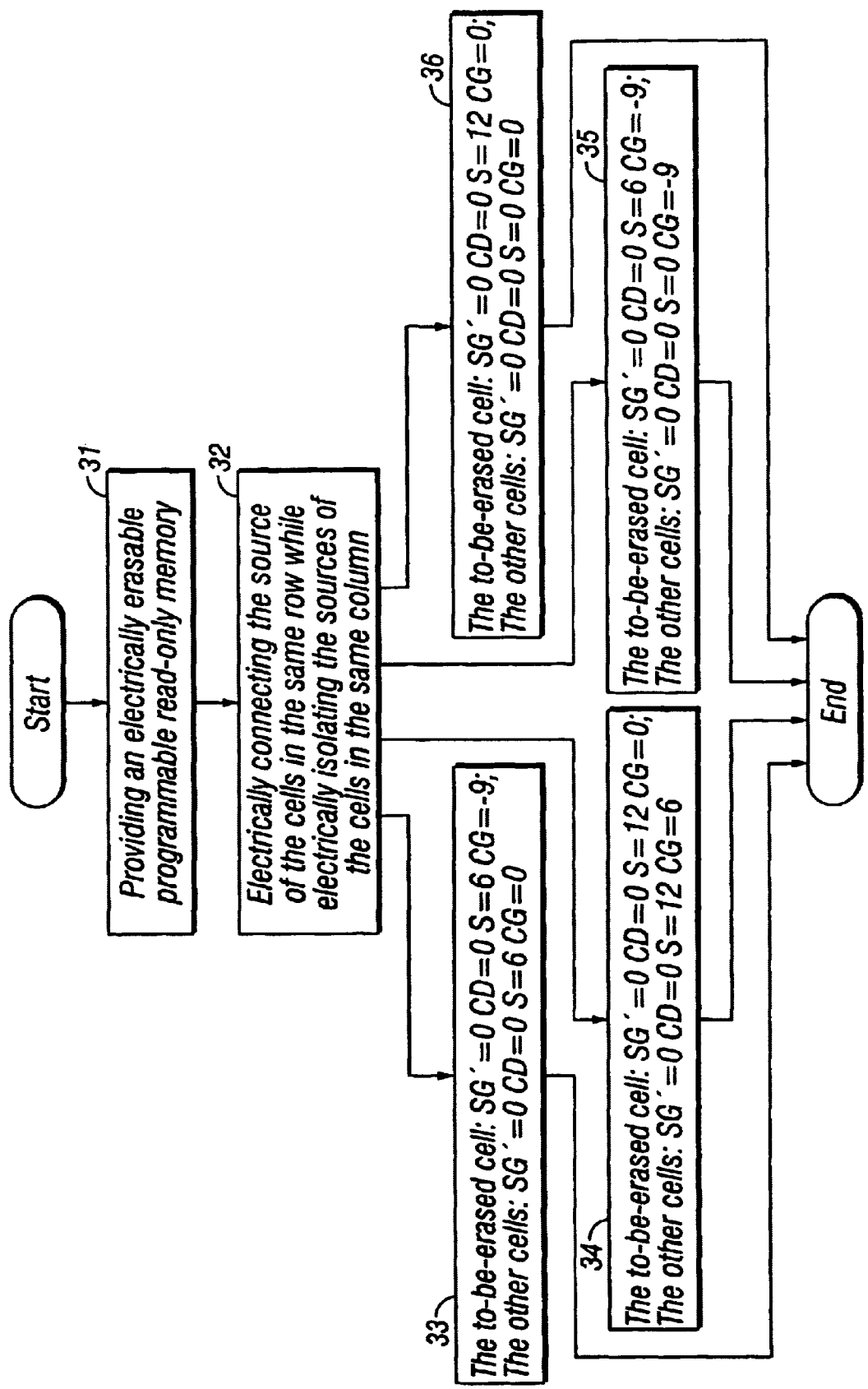
FIG. 3 is a flow chart showing an erasing method for an EERPOM according to an embodiment of the invention.

FIG. 3 is a flowchart of an erasing method for an electrically erasable programmable read-only memory according to one embodiment of the invention.

In step 31, an electrically erasable programmable read-only memory having memory cells arranged in an array is provided.

In step 32, the sources of the memory cells in the same row are electrically connected while the control and select gates of the memory cells in the same column are electrically isolated. The sources of the memory cells in the same column are electrically isolated while the control and select gates of the memory cells in the same row are electrically connected.

In step 33, a voltage of 0V is applied to the drain and select gate of each cell. A voltage of 6V is applied to the sources of the cells in the same column. The to-be-erased cell in the column receives a voltage of −9V on the control gate. The other cells in the column receive a voltage of 0V on the control gates.

In step 34, a voltage of 0V is applied to the drain and select gate of each cell. A voltage of 12V is applied to the sources of the cells in the same column. The to-be-erased cell in the column receives a voltage of 0V on the control gate. The other cells in the column receive a voltage of 6V on the control gates.

In step 35, a voltage of 0V is applied to the drain and select gate of each cell. A voltage of −9V is applied to the control gate of the cells in the same row. The to-be-erased cell in the row receives a voltage of 6V on the control gate. The other cells in the row receive a voltage of 0V on the control gates.

In step 36, a voltage of 0V is applied to the drain and select gate of each cell. A voltage of 0V is applied to the control gate of the cells in the same row. The to-be-erased cell in the row receives a voltage of 12V on the control gate. The other cells in the row receive a voltage of 0V on the control gates.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. An electrically erasable programmable read-only memory comprising:
    a first memory cell having a first control gate and a first source; and
    a second memory cell having second control gate and a second source;
    wherein if the first and second control gates are configured to receive a control gate voltage, the first source is configured to receive a first source voltage, and the second source is configured to receive a second source voltage different from the first source voltage so as to erase one of the first and second memory cells and to preserve another of the first and second memory cells, and
    wherein if the first and second sources are configured to receive a source voltage, the first control gate is configured to receive a first control gate voltage, and the second control gate is configured to receive a second control gate voltage different from the first control gate voltage so as to erase one of the first and second memory cells and to preserve another of the first and second memory cells.

2. The memory of claim 1 wherein the first memory cell comprises a first floating gate, a first select gate, and a first drain; and wherein the second memory cell comprises a second floating gate, a second select gate, and a second drain.

3. The memory of claim 2 wherein the first drain and the second drain are electrically coupled together.

4. The memory of claim 2 wherein the first select gate and the second select gate are electrically coupled together.

5. The memory of claim 1 wherein the first source voltage is sufficiently higher than the control gate voltage to erase the first memory cell and wherein the second source voltage is not sufficiently higher than the control gate voltage to erase the second memory cell.

6. The memory of claim 5 wherein the first source voltage is higher than the control gate voltage by at least about 12V.

7. The memory of claim 5 wherein the second source voltage is higher than the control gate voltage by no more than about 9V.

8. The memory of claim 7 wherein the second source voltage is higher than the control gate voltage by no more than about 6V.

9. The memory of claim 1 wherein the first and second control gates have a control gate voltage of about −9V, the first source has a first source voltage of at least about 6V, and the second source has a second source voltage of no greater than about 0V.

10. The memory of claim 1 wherein the first and second control gates have a control gate voltage of about 0V, the first source has a first source voltage of at least about 12V, and the second source has a second source voltage of no greater than about 0V.

11. The memory of claim 1 wherein the first and second sources have a source voltage of about 6V, the first control gate has a first control gate voltage of no greater than about −9V, and the second control gate has a second control gate voltage of at least about 0V.

12. The memory of claim 1 wherein the first and second sources have a source voltage of about 12V, the first control gate has a first control gate voltage of no greater than about 0V, and the second control gate has a second control gate voltage of at least about 6V.

13. An erasing method for an electrically erasable programmable read-only memory having a first memory cell and a second memory cell, the first memory cell having a first control gate and a first source and the second memory cell having second control gate and a second source, the method comprising:
    providing a control gate voltage to the first and second control gates, providing a first source voltage to the first source, and providing a second source voltage to the second source which is different from the first source voltage so as to erase one of the first and second memory cells and to preserve another of the first and second memory cells.

14. The method of claim 13 wherein the first memory cell comprises a first floating gate, a first select gate, and a first drain; and wherein the second memory cell comprises a second floating gate, a second select gate, and a second drain.

15. An erasing method for an electrically erasable programmable read-only memory having a first memory cell and a second memory cell, the first memory cell having a first control gate and a first source and the second memory cell having second control gate and a second source, the method comprising:

(1) providing a control gate voltage to the first and second control gates, providing a first source voltage to the first source, and providing a second source voltage to the second source which is different from the first source voltage so as to erase one of the first and second memory cells and to preserve another of the first and second memory cells; or (2) providing a source voltage to the first and second sources, providing a first control gate voltage to the first control gate, and providing a second control gate voltage to the second control gate which is different from the first control gate voltage so as to erase one of the first and second memory cells and to preserve another of the first and second memory cells;

wherein the first source voltage is sufficiently higher than the control gate voltage to erase the first memory cell and wherein the second source voltage is not sufficiently higher than the control gate voltage to erase the second memory cell.

16. The memory of claim 15 wherein the first source voltage is higher than the control gate voltage by at least about 12V.

17. The memory of claim 15 wherein the second source voltage is higher than the control gate voltage by no more than about 9V.

18. An erasing method for an electrically erasable programmable read-only memory having a first memory cell and a second memory cell, the first memory cell having a first control gate and a first source and the second memory cell having second control gate and a second source, the method comprising:

(1) providing a control gate voltage to the first and second control gates, providing a first source voltage to the first source, and providing a second source voltage to the second source which is different from the first source voltage so as to erase one of the first and second memory cells and to preserve another of the first and second memory cells; or (2) providing a source voltage to the first and second sources, providing a first control gate voltage to the first control gate, and providing a second control gate voltage to the second control gate which is different from the first control gate voltage so as to erase one of the first and second memory cells and to preserve another of the first and second memory cells;

wherein the first and second control gates have a control gate voltage of about −9V, the first source has a first source voltage of at least about 6V, and the second source has a second source voltage of no greater than about 0V.

19. An erasing method for an electrically erasable programmable read-only memory having a first memory cell and a second memory cell, the first memory cell having a first control gate and a first source and the second memory cell having second control gate and a second source, the method comprising:

(1) providing a control gate voltage to the first and second control gates, providing a first source voltage to the first source, and providing a second source voltage to the second source which is different from the first source voltage so as to erase one of the first and second memory cells and to preserve another of the first and second memory cells; or (2) providing a source voltage to the first and second sources, providing a first control gate voltage to the first control gate, and providing a second control gate voltage to the second control gate which is different from the first control gate voltage so as to erase one of the first and second memory cells and to preserve another of the first and second memory cells;

wherein the first and second control gates have a control gate voltage of about 0V, the first source has a first source voltage of at least about 12V, and the second source has a second source voltage of no greater than about 0V.

20. An erasing method for an electrically erasable programmable read-only memory having a first memory cell and a second memory cell, the first memory cell having a first control gate and a first source and the second memory cell having second control gate and a second source, the method comprising:

(1) providing a control gate voltage to the first and second control gates, providing a first source voltage to the first source, and providing a second source voltage to the second source which is different from the first source voltage so as to erase one of the first and second memory cells and to preserve another of the first and second memory cells; or (2) providing a source voltage to the first and second sources, providing a first control gate voltage to the first control gate, and providing a second control gate voltage to the second control gate which is different from the first control gate voltage so as to erase one of the first and second memory cells and to preserve another of the first and second memory cells;

wherein the first and second sources have a source voltage of about 6V, the first control gate has a first control gate voltage of no greater than about −9V, and the second control gate has a second control gate voltage of at least about 0V.

21. An erasing method for an electrically erasable programmable read-only memory having a first memory cell and a second memory cell, the first memory cell having a first control gate and a first source and the second memory cell having second control gate and a second source, the method comprising:

(1) providing a control gate voltage to the first and second control gates, providing a first source voltage to the first source, and providing a second source voltage to the second source which is different from the first source voltage so as to erase one of the first and second memory cells and to preserve another of the first and second memory cells; or (2) providing a source voltage to the first and second sources, providing a first control gate voltage to the first control gate, and providing a second control gate voltage to the second control gate which is different from the first control gate voltage so as to erase one of the first and second memory cells and to preserve another of the first and second memory cells;

wherein the first and second sources have a source voltage of about 12V, the first control gate has a first control gate voltage of no greater than about 0V, and the second control gate has a second control gate voltage of at least about 6V.

* * * * *